United States Patent [19]

Sakaue et al.

[11] 4,377,794
[45] Mar. 22, 1983

[54] CHARGE TRANSFER DEVICE COMB FILTER WITH IMPROVED FREQUENCY RESPONSE

[75] Inventors: Tatsuo Sakaue, Yokohama; Chikara Sato, Kawasaki, both of Japan

[73] Assignee: Tokyo Shibaura Denki Kabushiki Kaisha, Japan

[21] Appl. No.: 240,922

[22] Filed: Mar. 5, 1981

[30] Foreign Application Priority Data

Mar. 18, 1980 [JP] Japan .................................. 55-33350

[51] Int. Cl.³ ..................... H04N 9/535; H03H 11/06; H03H 17/06; G11C 19/28
[52] U.S. Cl. .............................. 333/165; 307/221 D; 357/24; 358/31
[58] Field of Search .......................... 333/165; 357/24; 307/221 D; 358/21 R, 31, 37

[56] References Cited

PUBLICATIONS

D. J. Sauer et al., A CCD Comb Filter IC for TV Receivers, 1980 IEEE International Solid-State Circuits Conference, p. 32, (Feb. 13, 1980).

Primary Examiner—Marvin L. Nussbaum
Attorney, Agent, or Firm—Finnegan, Henderson, Farabow, Garrett & Dunner

[57] ABSTRACT

A CCD comb filter includes long and short CCD delay lines connected to receive a common input signal and is arranged to combine output signals of the long and short CCD delay lines. In order to realize a CCD comb filter very close to an optimum comb filter the product of the number of stages of the long CCD delay line and the transfer inefficiency of each stage thereof is set substantially equal to the product of the number of stages of the short CCD delay line and the transfer inefficiency of each stage thereof. In order that the transfer inefficiency of the short CCD delay line may be made greater to satisfy the above-mentioned requirement, transfer electrodes of the short CCD delay line are designed such that their length as viewed in charge transfer direction is made larger than the length of transfer electrodes of the long CCD delay line.

2 Claims, 5 Drawing Figures

CHARGE TRANSFER DEVICE COMB FILTER WITH IMPROVED FREQUENCY RESPONSE

This invention relates to a charge coupled device (CCD) comb filter.

Comb filters can be used as a means for separating a luminance video signal Y and a chrominance video signal C included in a colorplexed composite video signal, and as a ground echo canceller for radar signals.

A comb filter for use in separating the luminance video signal and chrominance video signal uses a 1-H delay line for delaying a colorplexed composite video signal by one-horizontal total line period H (63.5 µs). A delayed composite video signal and undelayed composite video signal are additively combined to obtain the luminance signal Y and the delayed composite video signal and undelayed composite video signal are subtractively combined to obtain the chrominance video signal C.

In the past, a glass delay line is used as the 1-H delay line, but it has disadvantages in that it would be difficult to obtain an accurate delay time and that the delay time varies with temperature.

A comb filter using a CCD delay line capable of providing an accurate 1-H delay time is disclosed by D. J. Sauer et al in a paper entitled "A CCD Comb Filter IC for TV Receivers", 1980 IEE International Solid-State Circuits Conference, Digest of Technical papers page 32, Feb. 13, 1980. Such a CCD comb filter is shown in FIG. 1.

In the CCD comb filter shown in FIG. 1, a colorplexed composite video signal applied to an input terminal 10 is supplied to a long CCD delay line 11, to a first short CCD delay line 12 and through an inverting amplifier 14 with a gain of unity to a second short CCD delay line 13 having the number of stages equal to that of the CCD delay line 12. At a CCD channel 15 a charge signal from the long CCD delay line 11 is combined with a charge signal from the short CCD delay line 12 to provide a luminance video signal Y. At a CCD channel 16, on the other hand, the charge signal from the long CCD delay line 11 is combined with a charge signal from the short CCD delay line 13 to provide a chrominance signal C.

A delay time Td provided by the long CCD delay line 11 is defined as follows:

$$Td = (N_2 - N_1)/f_c \quad (1)$$

where
$N_2$ = the number of stages of the long CCD delay line 11
$N_1$ = the number of stages of the short CCD delay lines 12 and 13
$f_c$ = transfer clock pulse frequency Now suppose that $N_1=1$, $N_2=683.5$ and $f_c=10.7$ MHz. Then, Td=63.5 µs. From this it will appreciated that an accurate 1-H delay time can be provided in spite of the circumferential conditions.

Since in the charge transfer device, however, a transfer inefficiency defined as a residual amount of charge packet per stage is normally finite (of the order of $10^{-3}$ to $10^{-5}$), the gain characteristic R(f) and delay time characteristic Td(f) of the comb filter are different from ideal ones. As conveniently known in the art, these characteristics can be expressed as follows:

$$R(f) = \exp[-N\epsilon(1 - \cos 2\pi f/f_c)] \quad (2)$$

$$Td(f) = \frac{N}{f_c}\left(1 + \frac{f_c}{2\pi f}\epsilon \sin\frac{2\pi f}{f_c}\right) \quad (3)$$

If, in the above-mentioned comb filter, $\epsilon$ of the short delay line is equal to $\epsilon$ of the long delay line and the number of stages of the short delay lines is 1 or so, then $N_1\epsilon < < N_2\epsilon$. A variation in the gain characteristic and delay time characteristic of the short delay line due to the transfer inefficiency $\epsilon$ can be neglected.

Therefore, the transfer function relating to the luminance signal Y of the comb filter of FIG. 1 can be expressed as follows, by referring to FIG. 2.

$$H(z) = 1 + \frac{R(f)}{R(f_{ADJ})} z^{-1} \quad (4)$$

where $z^{-1} = \cos 2\pi f Td - j \sin 2\pi f Td$ and $f_{ADJ}$ denotes an adjusting frequency at which the gain of the long CCD delay line is equal to that of the short CCD delay line. In order to obtain the luminance signal Y, $f_{ADJ}$ is set at the color subcarrier frequency $f_{SC}$ of 3.58 MHz.

From Equation (4) the gain characteristic $|H(f)|$ and phase characteristic Q(f) of the comb filter are found as follows:

$$|H(f)| = \sqrt{1 + \left(\frac{R(f)}{R(f_{ADJ})}\right)^2 + 2\frac{R(f)}{R(f_{ADJ})}\cos 2\pi f Td} \quad (5)$$

$$\theta(f) = -\tan^{-1}\frac{\frac{R(f)}{R(f_{ADJ})}\sin 2\pi f Td}{1 + \frac{R(f)}{R(f_{ADJ})}\cos 2\pi f Td} \quad (6)$$

where Td denotes a delay time as expressed in Equation (3).

Suppose, for example, that $N = N_2 - N_1 = 682.5$, $\epsilon = 1 \times 10^{-4}$, $f_{ADJ} = f_{SC} = 3.579545$ MHz and $f_c = 3f_{SC} = 10.7$ MHz. From Equation (5) the comb depth at $f = f_{SC}$, that is, at a theoretic null frequency, can be calculated as follows:

$$D = 20 \log \frac{2}{|H(f_{SC})|} = 30.6 \text{ dB}$$

A difference between the actual null frequency and theoretic null frequency is $$\Delta f = f_{SC} - \frac{f_{SC}}{1 + \frac{f_c}{2\pi f_{SC}} \times \epsilon \times \sin\frac{2\pi f_{SC}}{f_c}}$$

$$= 148 \text{ Hz.}$$

Where, therefore, $\epsilon$ is finite, the degradation of comb characteristic occurs. Where the actual null frequency is deviated from the theoretic null frequency, a separation between the luminance signal and chrominance signal is lowered.

It is accordingly an object of this invention to provide a CCD comb filter having an improved comb filter characteristic.

Another object of this invention is to provide, in order to improve the comb filter characteristics, a CCD comb filter having long and short CCD delay lines connected to receive a common input signal, in which the length of transfer electrodes of the short CCD delay line as viewed in charge transfer direction is made longer than that of transfer electrodes of the long CCD delay line.

In accordance with this invention, in a CCD comb filter including long and short CCD delay lines connected to receive a common input signal and arranged to combine an output charge packet of the long CCD delay line with that of the short CCD delay line, the product of the number of stages of the long CCD delay line and transfer inefficiency of each stage thereof is set substantially equal to that of the number of stages of the short CCD delay line and transfer inefficiency of each stage thereof.

In order to make the transfer inefficiency of the short CCD delay line greater than the transfer inefficiency of the long CCD delay line the length of transfer electrodes of the short CCD delay line as viewed in the charge transfer direction is formed larger than that of transfer electrodes of the long CCD delay line.

This invention can be more fully understood from the following detailed description when taken in conjunction with the accompanying drawings, in which.

Figure 1:
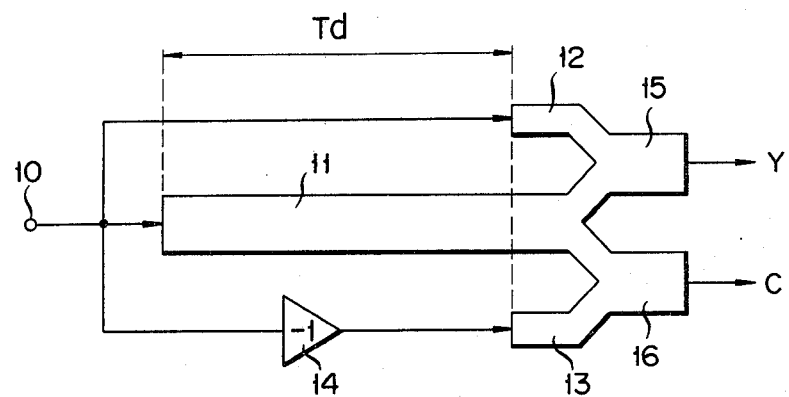
FIG. 1 shows a schematic arrangement of a CCD comb filter.
Figure 2:
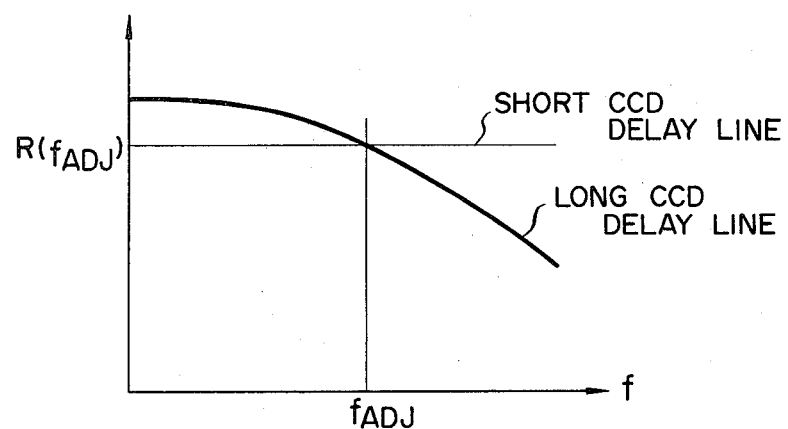
FIG. 2 shows the frequency response of the long CCD delay line and short CCD delay line.
Figure 3:
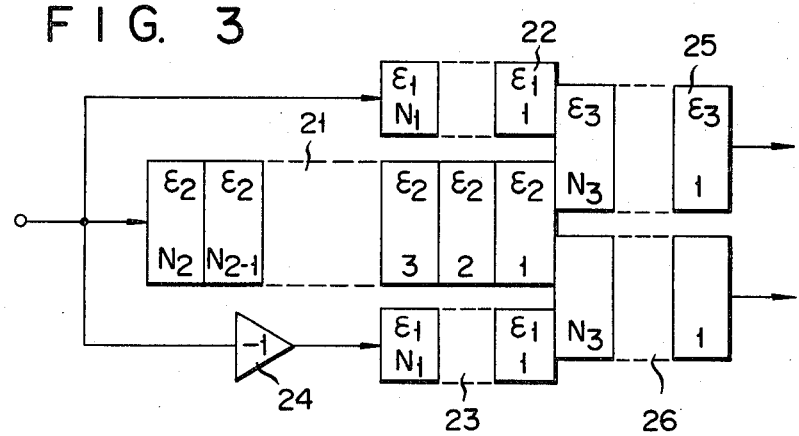
FIG. 3 shows an arrangement for explaining a CCD comb filter of this invention.

Referring to FIG. 3 a CCD comb filter embodying this invention, like the comb filter as shown in FIG. 1, comprises a long CCD delay line 21, first and second short CCD delay lines 22 and 23, first and second CCD output lines 25 and 26 and an inverting amplifier 24 having a gain of unity. As shown in FIG. 3, the long CCD delay line 21 has $N_2$ stages each having a transfer inefficiency $\epsilon_2$ and the first and second short CCD delay lines 22 and 23 have $N_1$ stages each having a transfer inefficiency $\epsilon_1$. The first and second CCD output lines 25, 26 include $N_3$ stages each having a transfer inefficiency $\epsilon_3$.

The comb filter of this invention is so designed that the number of stages $N_1$ and $N_2$ of the delay lines and transfer inefficiencies $\epsilon_1$ and $\epsilon_2$ have the following relation:

$$N_1\epsilon_1 \simeq N_2\epsilon_2$$

In the comb filter of FIG. 3 the gain characteristic $R_1(f)$ and delay time characteristic $Td_1(f)$ of the short delay lines 22, 23 and gain characteristic $R_2(f)$ and delay time characteristic $Td(f)$ of the long delay line 21 are given below $$R_1(f) = \exp[-N_1\epsilon_1(1 - \cos 2\pi f/f_c)] \quad (8)$$

$$R_2(f) = \exp[-N_2\epsilon_2(1 - \cos 2\pi f/f_c)] \quad (9)$$

$$Td_1(f) = \frac{N_1}{f_c}\left(1 + \frac{f_c}{2\pi f} \times \epsilon_1 \times \sin\frac{2\pi f}{f_c}\right) \quad (10)$$

-continued $$Td_2(f) = \frac{N_2}{f_c}\left(1 + \frac{f_c}{2\pi f} \times \epsilon_2 \times \sin\frac{2\pi f}{f_c}\right) \quad (11)$$

The transfer function of the comb filter is found as follows:

$$H(z) = R_1(f)z_1^{-1} + R_2(f)z_2^{-1} \quad (12)$$

where
$$z_1^{-1} = \cos 2\pi f Td_1 - j \sin 2\pi f Td_1$$

$$z_2^{-1} = \cos 2\pi f Td_2 - j \sin 2\pi f Td_2$$

If $N_1\epsilon_1 \simeq N_2\epsilon_2$, the gain response and phase response are given by $$|H(f)| = 2|\cos \pi f Td_0| \quad (13)$$

$$\theta(f) = -\pi f Td_0 \quad (14)$$

where $Td_0(f) = Td_2(f) - Td_1(f) = \frac{1}{f_c}(N_2 - N_1)$

The gain response and phase response of Equations (13) and (14) are the same as those of an ideal comb filter. According to this invention, a comb filter very close to the ideal comb filter can be realized, using a charge transfer device having a finite transfer inefficiency.

In the charge transfer device, the transfer inefficiency is produced due to a variety of reasons. In any case, all of the charge packet is not transferred from stage to stage in a finite time. That is, this is due to the fact that the transfer speed of the charge packet is slow. The transfer speed of the charge packet is dependent upon the thermal diffusion, self-induced drift, fringing field drift, etc., particularly upon the thermal diffusion.

The time constant of thermal diffusion can be expressed as follows:

$$\tau_{th} = 4L^2/\pi^2 D^2 \quad (15)$$

where
D = diffusion coefficient (constant) of carriers
L = length of a transfer electrode as viewed in charge transfer direction From Equation (15) it will be appreciated that the larger the transfer electrode as viewed in charge transfer direction the greater the time constant of thermal diffusion i.e. the lower the charge transfer speed becomes and hence the charge transfer speed or the transfer inefficiency can be adjusted by the length of the transfer electrode.

Figure 4:
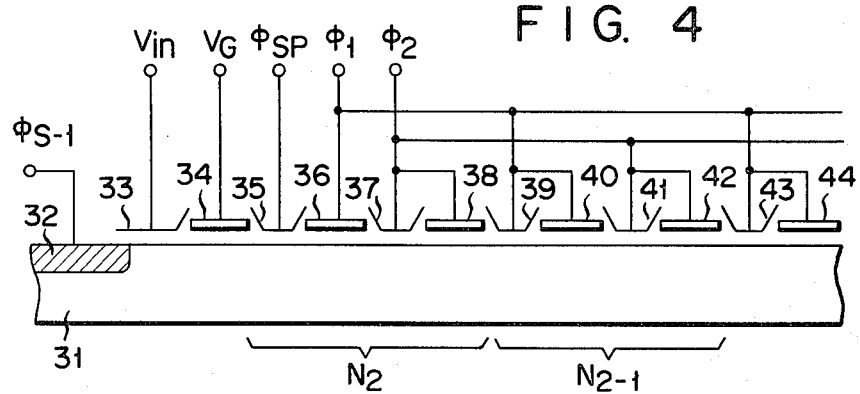
FIGS. 4 and 5, each, show a schematic arrangement of long and short CCD delay lines of the comb filter of FIG. 3.
Figure 5:
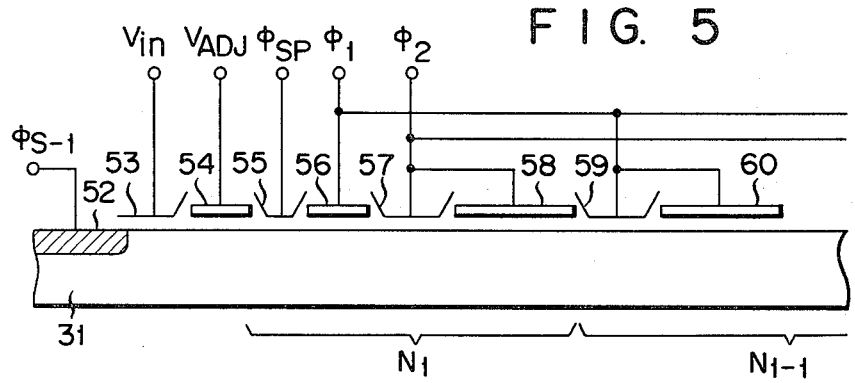

FIGS. 4 and 5, each, diagrammatically show an arrangement of CCD delay lines which may be used as the long delay line 21 and short delay lines 22, 23 as shown in FIG. 3. The CCD delay lines as shown in FIGS. 4 and 5 use a potential equilibration method to inject charges and two-phase driving system.

In the long CCD delay line as shown in FIG. 4, a predetermined amount of charge is injected into a semiconductor substrate 31 by a source region 32 formed in the substrate which is supplied with a source pulse $\phi_{s-1}$. An input signal $V_{in}$ is applied to an input electrode 33 adjacent to the source region so that a charge packet corresponding to an instantaneous amplitude of the input signal is transferred to a potential well below a gate electrode 34 to which a predetermined voltage $V_G$ is applied and temporarily stored therein. When a sampling pulse $\phi_{SP}$ is applied to a sampling electrode 35, the charge packet stored below the gate electrode 34 is transferred to the region below a transfer electrode 36. Thereafter, the charge packet is transferred under the action of clock pulses $\phi_1$ and $\phi_2$ along a channel which is formed below transfer electrodes 36, 37, ..., 44. In FIG. 4, the transfer electrodes 35, 36, 37 and 38 form a first stage $N_2$ of the long CCD line 21 as shown in FIG. 3 and the transfer electrodes 39, 40, 41 and 42 form the second stage $N_{2-1}$.

The short CCD delay line of FIG. 5 has an arrangement similar to the long CCD delay line of FIG. 4. A charge is injected through a source region 52 in the substrate 31. The injected charge is modulated by an input signal $V_{in}$ which is applied to an input electrode 53, with the result that a charge packet corresponding to an instantaneous amplitude of the input signal $V_{in}$ is transferred to a potential well below a gate electrode 54 to which an adjusting voltage $V_{ADJ}$ is applied. The charge packet stored below the gate electrode 54 is transferred by a sampling electrode 55, to which the sampling pulse $\phi_{SP}$ is applied, to a channel below transfer electrodes 56, 57, 58, 59, 60 .... In the arrangement as shown in FIG. 5, the gate electrode 54 supplied with the adjusting voltage $V_{ADJ}$ is adapted to cause a charge packet the same in quantity as that injected into the long delay line of FIG. 4 to be injected into the short delay line when a common input signal $V_{in}$ is applied to an input terminal. The electrodes 55 to 58 form the first stage $N_1$ of the short delay line.

In order to achieve $N_1\epsilon_1 \simeq N_2\epsilon_2$, as shown in FIGS. 4 and 5, the length of the transfer electrodes of the short CCD delay line as viewed in the charge transfer direction is set longer than that of the transfer electrodes of the long CCD delay line. In this case, it is not necessarily required that $N_1\epsilon_1=N_2\epsilon_2$. An error is allowed within a range of ±50%. Suppose, for example, that $\epsilon_2=5\times10^{-3}$ when $N_1=692.5$, $\epsilon_1=1\times10^{-4}$ and $N_2=10$. In this case, the above-mentioned comb depth D and the error $\Delta f$ of the actual null frequency with respect to the theoretic null frequency (3.58 MHz) are D=42 dB $\Delta f$=42 Hz These values are in a practically allowable range. If under the above-mentioned conditions the electrode length corresponding to $\epsilon_2$ is 10 microns, the electrode length corresponding to $\epsilon_1$ will be about 70 microns.

What we claim is:

1. A CCD comb filter including long and short CCD delay lines connected to receive a common input signal and arranged to combine output charge packets of said long and short CCD delay lines characterized in that the product of the number of stages of said long CCD delay line and transfer inefficiency of each stage thereof is substantially equal to that of the number of stages of said short CCD delay line and transfer inefficiency of each stage thereof.

2. A CCD comb filter including long and short CCD delay lines connected to receive a common input signal and each having transfer electrodes driven by a common clock pulse to transfer signal charge packets, output charge packets of said long and short CCD delay lines being combined, characterized in that the length of transfer electrodes of said short CCD delay line as viewed in the charge transfer direction is larger than that of said transfer electrodes of said long CCD delay line.

* * * * *